(12) United States Patent
Kim et al.

(10) Patent No.: US 10,353,129 B2
(45) Date of Patent: Jul. 16, 2019

(54) OPTICAL FILM AND METHOD OF MANUFACTURING THE SAME AND DISPLAY DEVICE INCLUDING THE SAME

(71) Applicants: SAMSUNG ELECTRONICS CO., LTD., Suwon-si (KR); SAMSUNG SDI CO., LTD., Yongin-si (KR)

(72) Inventors: Hyung Jun Kim, Suwon-si (KR); Sangah Gam, Seoul (KR); Hye Young Kong, Uijeongbu-si (KR); Jong Hoon Won, Yongin-si (KR); Myungsup Jung, Seongnam-si (KR)

(73) Assignees: SAMSUNG ELECTRONICS CO., LTD., Gyeonggi-Do (KR); SAMSUNG SDI CO., LTD., Gyeonggi-Do (KR)

(*) Notice: Subject to any disclaimer, the term of this patent is extended or adjusted under 35 U.S.C. 154(b) by 79 days.

(21) Appl. No.: 15/282,319

(22) Filed: Sep. 30, 2016

(65) Prior Publication Data
US 2017/0097455 A1  Apr. 6, 2017

(30) Foreign Application Priority Data
Oct. 1, 2015  (KR) .................. 10-2015-0138699

(51) Int. Cl.
| G02B 5/30 | (2006.01) |
| G02B 27/28 | (2006.01) |
| G02B 1/14 | (2015.01) |
| G02F 1/13363 | (2006.01) |
| H01L 27/32 | (2006.01) |
| G02B 1/04 | (2006.01) |

(52) U.S. Cl.
CPC ............. *G02B 5/3083* (2013.01); *G02B 1/04* (2013.01); *G02B 1/14* (2015.01);
(Continued)

(58) Field of Classification Search
CPC .. G02B 5/0026; G02B 5/0221; G02B 5/0242; G02B 5/0278; G02B 5/0294;
(Continued)

(56) References Cited

U.S. PATENT DOCUMENTS

| 7,476,425 B2 | 1/2009 | Obara et al. |
| 7,985,803 B2 | 7/2011 | Yonezawa et al. |

(Continued)

FOREIGN PATENT DOCUMENTS

| CN | 103403090 | 11/2013 |
| JP | 2006010812 | 1/2006 |

(Continued)

OTHER PUBLICATIONS

Extended European Search Report—European Patent Application No. 16191166.4 dated Mar. 10, 2017.
(Continued)

*Primary Examiner* — Mustak Choudhury
(74) *Attorney, Agent, or Firm* — Cantor Colburn LLP

(57) ABSTRACT

An optical film includes a polarizer and a protection film disposed the polarizer and including a polymer having a glass transition temperature of greater than about 100° C., where the polymer is a terpolymer consisting of: a first structural unit derived from styrene or a styrene derivative; a second structural unit derived from maleimide, maleic anhydride, acrylonitrile, a derivative thereof or a combination thereof; and a third structural unit derived from (meth) acrylate or a derivative thereof.

16 Claims, 4 Drawing Sheets

(52) U.S. Cl.
CPC .... *G02F 1/133634* (2013.01); *H01L 27/3232* (2013.01); *G02B 5/3025* (2013.01); *G02F 2001/133638* (2013.01); *G02F 2413/12* (2013.01)

(58) Field of Classification Search
CPC ...... G02B 5/206; G02B 5/305; G02B 5/3016; G02B 5/3025; G02B 5/3033; G02B 5/3083; G02B 1/04; G02B 1/10; G02B 1/11; G02B 1/14; G02B 1/105; G02B 1/111; G02F 1/13; G02F 1/1395; G02F 1/1396; G02F 1/13363; G02F 1/133528; G02F 1/133632; G02F 1/133634; G02F 2413/12; G02F 2001/133633; G02F 2001/133638; H01L 27/3232; C08L 33/10; C08L 33/20
USPC ................ 359/485.01, 489, 580; 428/1.3
See application file for complete search history.

(56) References Cited

U.S. PATENT DOCUMENTS

| | | | |
|---|---|---|---|
| 8,928,976 B2 | 1/2015 | Kang et al. | |
| 2006/0216436 A1* | 9/2006 | Obara | G02B 5/3033 428/1.3 |
| 2009/0068380 A1 | 3/2009 | Zheng et al. | |
| 2009/0086318 A1* | 4/2009 | Yaegashi | B32B 37/12 359/485.01 |
| 2011/0297896 A1 | 12/2011 | Kim et al. | |
| 2013/0190451 A1 | 7/2013 | Choi et al. | |
| 2013/0314785 A1 | 11/2013 | Kang et al. | |
| 2014/0362330 A1 | 12/2014 | Tamagawa | |

FOREIGN PATENT DOCUMENTS

| | | |
|---|---|---|
| JP | 4068120 | 3/2008 |
| JP | 2008256951 | 10/2008 |
| JP | 2011242754 | 12/2011 |
| JP | 2012032696 | 2/2012 |
| JP | 5553580 | 7/2014 |
| KR | 1020110118092 | 10/2011 |
| KR | 101214049 | 12/2012 |
| TW | 201331288 | 8/2013 |

OTHER PUBLICATIONS

Chinese Office Action—Chinese Application No. 201610868494.4 dated Apr. 28, 2019, citing references listed within.

* cited by examiner

OPTICAL FILM AND METHOD OF MANUFACTURING THE SAME AND DISPLAY DEVICE INCLUDING THE SAME

CROSS-REFERENCE TO RELATED APPLICATIONS

This application claims priority to Korean Patent Application No. 10-2015-0138699, filed on Oct. 1, 2015, and all the benefits accruing therefrom under 35 U.S.C. § 119, the content of which in its entirety is herein incorporated by reference.

BACKGROUND

1. Field

The disclosure relates to an optical film, a method of manufacturing the optical film, and a display device including the optical film.

2. Description of the Related Art

Commonly used flat panel displays may be classified into a light-emitting display device that emits light by itself and a non-emissive display device that uses a separate light source, and an optical film is frequently employed for improving the image quality thereof.

However, a currently-developed optical film may have weak optical durability, has an effect on display quality, and has drawbacks when making a thin display device due to its thick thickness.

SUMMARY

An embodiment provides an optical film having improved optical durability and a thin thickness.

Another embodiment provides a method of manufacturing the optical film.

Yet another embodiment provides a display device including the optical film.

According to an embodiment, an optical film includes a polarizer and a protection film disposed on the polarizer and including a polymer having a glass transition temperature of greater than about 100° C., where the polymer is a terpolymer consisting of a first structural unit derived from styrene or a styrene derivative, a second structural unit derived from maleimide, maleic anhydride, acrylonitrile, a derivative thereof or a combination thereof and a third structural unit derived from (meth)acrylate or a derivative thereof.

In an embodiment, refractive indices of the protection film may satisfy the following inequations: $n_{z1}>n_{x1}$; and $n_{z1}>n_{y1}$, where $n_{x1}$ denotes a refractive index at a slow axis of the protection film, $n_{y1}$ denotes a refractive index at a fast axis of the protection film, and $n_{z1}$ denotes a refractive index in a direction perpendicular to the slow axis and the fast axis of the protection film.

In an embodiment, retardations of the protection film may satisfy the following inequations: $-60 \text{ nm} \le R_{o1}(550 \text{ nm}) \le 60$ nm; and $-200 \text{ nm} \le R_{th1}(550 \text{ nm}) < -10$ nm, where $R_{o1}(550$ nm) denotes an in-plane retardation of the protection film at 550 nanometers (nm) wavelength, and $R_{th1}$ (550 nm) denotes a thickness direction retardation of the protection film at 550 nm wavelength.

In an embodiment, refractive indices of the protection film may satisfy the following in equation: $n_{y1}<n_{x1}=n_{z1}$, where $n_{x1}$ denotes a refractive index at a slow axis of the protection film, $n_{y1}$ denotes a refractive index at a fast axis of the protection film, and $n_{z1}$ denotes a refractive index in a direction perpendicular to the slow axis and the fast axis of the protection film.

In an embodiment, retardations of the protection film may satisfy the following inequation: $110 \text{ nm} \le R_{o1}(550 \text{ nm}) \le 300$ nm; and $-300 \text{ nm} \le R_{th1}(550 \text{ nm}) \le 0$ nm, where $R_{o1}(550$ nm) denotes an in-plane retardation of the protection film at 550 nm wavelength, and $R_{th1}$ (550 nm) denotes a thickness direction retardation of the protection film at 550 nm wavelength.

In an embodiment, the first structural unit may be derived from styrene, substituted or unsubstituted alkyl styrene, substituted or unsubstituted aryl styrene, halogen styrene, substituted or unsubstituted alkoxy styrene, substituted or unsubstituted nitro styrene, substituted or unsubstituted amino styrene, substituted or unsubstituted carboxyl styrene, or a combination thereof.

In an embodiment, the first structural unit, the second structural unit and the third structural unit may be included in an amount of about 10 mol % to about 50 mol %, about 10 mol % to about 40 mol %, and about 10 mol % to about 80 mol % based on the terpolymer, respectively.

In an embodiment, the glass transition temperature of the polymer may be in a range of about 110° C. to about 150° C.

In an embodiment, the protection film may be about 1.1 times to about 5.0 times elongated.

In an embodiment, the protection film may be biaxially elongated.

In an embodiment, the protection film may have a thickness ranging from about 5 micrometer (μm) to about 30 micrometer (μm).

In an embodiment, the polarizer and the protection film may be bonded to each other.

In an embodiment, the optical film may further include a compensation film disposed on the protection film, where the compensation film may be a λ/4 retardation film or a λ/2 retardation film.

In an embodiment, refractive indices of the compensation film may satisfy the following inequations: $n_{x2}>n_{y2}$; and $n_{x2}>n_{z2}$, where $n_{x2}$ denotes a refractive index at a slow axis of the compensation film, $n_{y2}$ denotes a refractive index at a fast axis of the compensation film, and $n_{z2}$ denotes a refractive index in a direction perpendicular to the slow axis and the fast axis of the compensation film.

According to another embodiment, a display device includes the optical film described above.

According to yet another embodiment, a method of manufacturing an optical film includes: preparing a polarizer; melt-extruding a polymer having a glass transition temperature of greater than about 100° C., and elongating the resultant to prepare a protection film; and combining the polarizer and the protection film. In an embodiment, the polymer may be a terpolymer consisting of: a first structural unit derived from styrene or a styrene derivative; a second structural unit derived from maleimide, maleic anhydride, acrylonitrile, a derivative thereof or a combination thereof; and a third structural unit derived from (meth)acrylate or a derivative thereof. In an embodiment, the melt-extruding the polymer may be performed at a temperature in a range of about 200° C. to about 350° C., and the elongating the polymer may be performed at a temperature in a range of a glass transition temperature of the polymer ±30° C.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
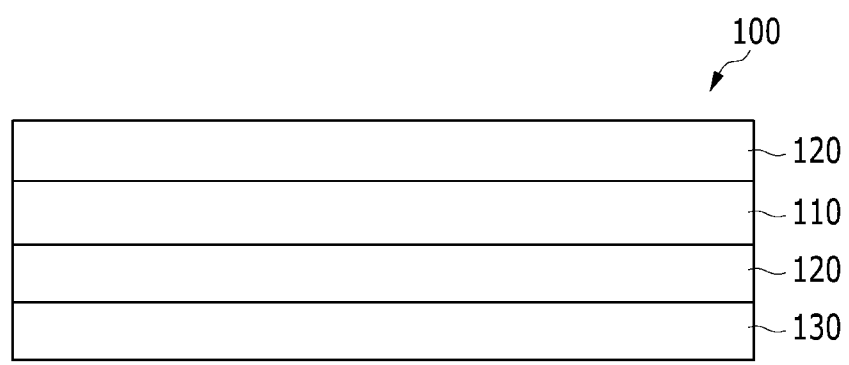
FIG. 1 is a schematic cross-sectional view showing an optical film according to an embodiment.

Exemplary embodiments will hereinafter be described in detail, and may be easily performed by those who have common knowledge in the related art. However, this disclosure may be embodied in many different forms, and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. On the contrary, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to one substituted with at least one substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound or a group.

Hereinafter, an embodiment of an optical film according to the invention will be described in detail referring to the accompanying drawings.

FIG. 1 is a schematic cross-sectional view showing an optical film according to an embodiment.

Referring to FIG. 1, an embodiment of an optical film 100 includes a polarizer 110 and a protection film 120 disposed on the polarizer 110, e.g., on a surface or opposing surfaces of the polarizer 110. In one embodiment, for example, the protection film 120 may be disposed on both of an upper surface and a lower surface of the polarizer 110, as shown in FIG. 1.

The polarizer 110 polarizes unpolarized incident light. In an embodiment, the polarizer 110 may include, for example a polyvinyl alcohol ("PVA") including an iodine and/or a dichroic dye, but not being limited thereto. The polarizer 110 may include, for example, an elongated film.

The protection film 120 may mechanically and physically protect a polarizer 110, and may have high light transmittance and low haze. The protection film 120 may have, for example, a light transmittance of about 70% or greater and a haze of about 3% or less. The protection film 120 may have, for example, light transmittance in a range of about 80% to about 100% and a haze in a range of about 0.01% to about 2%.

The protection film 120 may be an anisotropic polymer film.

The protection film 120 may be, for example, a polymer film having negative birefringence.

In one embodiment, for example, the protection film 120 may have refractive indices satisfying the following Relationship Inequations 1 and 2.

$$n_{z1} > n_{x1} \qquad \text{[Relationship Inequation 1]}$$

$$n_{z1} > n_{y1} \qquad \text{[Relationship Inequation 2]}$$

In Relationship Inequations 1 and 2, $n_{x1}$ denotes a refractive index of the protection film 120 in a direction where in-plane refractive index is largest (hereinafter, referred to as 'slow axis'), $n_{y1}$ denotes a refractive index of the protection film 120 in a direction where in-plane refractive index is smallest (hereinafter, referred to as a 'fast axis'), and $n_{z1}$ denotes a refractive index in a direction perpendicular to the slow axis and the fast axis of the protection film 120.

In such an embodiment, where the protection film 120 may have the refractive indices satisfying Relationship Inequations 1 and 2 above, a compensation function of reducing dependency of a viewing angle may be implemented.

In one embodiment, for example, the protection film 120 may have refractive indices satisfying the following Relationship Inequation 1a.

$$n_{z1} > n_{x1} = n_{y1} \qquad \text{[Relationship Inequation 1a]}$$

In an embodiment, where the protection film 120 may have refractive indices satisfying Relationship Inequation 1a, $n_{x1}$ and $n_{y1}$ of the protection film 120 may be equal to each other, or substantially the same as each other. In an embodiment, where $n_{x1}$ and $n_{y1}$ of the protection film 120 are substantially the same as each other, $n_{x1}$ and $n_{y1}$ of the protection film 120, for example, have a refractive index difference of less than or equal to about 10% of $n_{x1}$ or $n_{y1}$, or less than or equal to about 5% of $n_{x1}$ or $n_{y1}$.

In such an embodiment, the refractive indices of the protection film 120 may satisfy Relationship Inequation 1a and thus substantially have in-plane isotropy.

In an embodiment, the protection film 120 may have retardation.

The retardation of the protection film 120 may include an in-plane retardation ($R_{o1}$) and a thickness direction retardation ($R_{th1}$). The in-plane retardation ($R_{o1}$) of the protection film 120 is retardation generated in an in-plane direction of the protection film 120 and may satisfy the following equation: $R_{o1} = (n_{x1} - n_{y1}) \times d_1$. The thickness direction retardation $R_{th1}$ of the protection film 120 is retardation generated in a thickness direction of the protection film 120 and may satisfy the following equation: $R_{th1} = [\{(n_{x1} + n_{y1})/2\} - n_{z1}] \times d_1$. Herein, $d_1$ denotes a thickness of the protection film 120.

The protection film 120 may have an in-plane retardation and a thickness direction retardation adjusted within a predetermined range by changing $n_{x1}$, $n_{y1}$, $n_{z1}$, and/or thicknesses.

The protection film 120 having the refractive indices satisfying the Relationship Inequations 1 and 2 may have retardations, for example, satisfying the following Relationship Inequations 3 and 4.

$$-60\ \text{nm} \leq R_{o1}(550\ \text{nm}) \leq 60\ \text{nm} \qquad \text{[Relationship Inequation 3]}$$

$$-300\ \text{nm} \leq R_{th1}(550\ \text{nm}) < -10\ \text{nm} \qquad \text{[Relationship Inequation 4]}$$

In Relationship Inequation 3 and 4, $R_{o1}$ (550 nm) denotes the in-plane retardation of the protection film at 550 nm wavelength (e.g., measured with light having wavelength of about 550 nm), and $R_{th1}$ (550 nm) denotes the thickness direction retardation of the protection film at 550 nm wavelength.

The protection film 120 having retardations satisfying Relationships Inequations 3 and 4 may reduce or offset a thickness direction retardation, and decrease dependency of a viewing angle and resultantly, perform a compensation function.

In such an embodiment, the retardations of the protection film 120 may satisfy, for example, the following Relationship Inequations 3a-1 and/or 4a-1.

$$-10\ \text{nm} < R_{o1}(550\ \text{nm}) < 10\ \text{nm} \qquad \text{[Relationship Inequation 3a-1]}$$

$$-200\ \text{nm} \leq R_{th1}(550\ \text{nm}) \leq -20\ \text{nm} \qquad \text{[Relationship Inequation 4a-1]}$$

In such an embodiment, where the retardations of the protection film 120 satisfy Relationship Inequations 3a-1 and/or 4a-1, the protection film 120 may have, for example, retardations satisfying the following Relationship Inequations 3a-2 and/or 4a-2.

$$-5\ \text{nm} \leq R_{o1}(550\ \text{nm}) \leq 5\ \text{nm} \qquad \text{[Relationship Inequation 3a-2]}$$

$$-190\ \text{nm} \leq R_{th1}(550\ \text{nm}) \leq -30\ \text{nm} \qquad \text{[Relationship Inequation 4a-2]}$$

In such an embodiment, where the retardations of the protection film 120 satisfy Relationship Inequations 3a-2 and/or 4a-2, the protection film 120 may have, for example, retardations satisfying the following Relationship Inequations 3a-3 and/or 4a-3.

$$0\ \text{nm} \leq R_{o1}(550\ \text{nm}) \leq 5\ \text{nm} \qquad \text{[Relationship Inequation 3a-3]}$$

$$-180\ \text{nm} \leq R_{th1}(550\ \text{nm}) < -40\ \text{nm} \qquad \text{[Relationship Inequation 4a-3]}$$

In one alternative embodiment, for example, the protection film 120 may have refractive indices satisfying the following Relationship Inequation 5.

$$n_{y1} < n_{x1} = n_{z1} \qquad \text{[Relationship Inequation 5]}$$

In Relationship Inequation 5, $n_{x1}$ denotes the refractive index at the slow axis of the protection film 120, $n_{y1}$ denotes the refractive index at the fast axis of the protection film 120, and $n_{z1}$ denotes the refractive index in the direction perpendicular to the slow axis and the fast axis of the protection film 120.

In an embodiment, where the protection film 120 may have refractive indices satisfying Relationship Inequation 5, $n_{x1}$ and $n_{z1}$ of the protection film 120 may be equal to each other, or substantially the same as each other. In an embodiment, where $n_{x1}$ and $n_{z1}$ of the protection film 120 are substantially the same as each other, $n_{x1}$ and $n_{z1}$ of the protection film 120, for example, have a refractive index difference of less than or equal to about 10% of $n_{x1}$ or $n_{z1}$, or less than or equal to about 5% of $n_{x1}$ or $n_{z1}$, within the range.

In an embodiment, where the protection film 120 may have refractive indices satisfying Relationship Inequation 5, the retardation of the protection film 120 may satisfy, for example, the following Relationship Inequations 6 and 7.

$$110\ \text{nm} \leq R_{o1}(550\ \text{nm}) \leq 300\ \text{nm} \qquad \text{[Relationship Inequation 6]}$$

$$-300\ \text{nm} \leq R_{th1}(550\ \text{nm}) \leq 0\ \text{nm} \qquad \text{[Relationship Inequation 7]}$$

In Relationship Inequations 6 and 7, $R_{o1}$ (550 nm) denotes the in-plane retardation of the protection film 120 at 550 nm wavelength, and $R_{th1}$ (550 nm) denotes the thickness direction retardation of the protection film 120 at 550 nm wavelength.

In an embodiment, the protection film 120 may include, for example a polymer having negative birefringence.

In such an embodiment, the polymer may include, for example a structural unit derived from styrene or a styrene derivative. The structural unit derived from styrene or a styrene derivative may be, for example, a structural unit derived from styrene, a substituted or unsubstituted alkyl styrene, a substituted or unsubstituted aryl styrene, halogen styrene, a substituted or unsubstituted alkoxy styrene, a substituted or unsubstituted nitro styrene, a substituted or unsubstituted amino styrene, a substituted or unsubstituted carboxyl styrene or a combination thereof, but is not limited thereto. In one embodiment, for example, the structural unit derived from styrene or a styrene derivative may be a structural unit derived from a substituted or unsubstituted C1 to C20 alkyl styrene, a substituted or unsubstituted C6 to C20 aryl styrene, styrene substituted one or two halogen elements, a substituted or unsubstituted C1 to C5 methoxy styrene, a substituted or unsubstituted nitro styrene, a substituted or unsubstituted amino styrene, a substituted or unsubstituted carboxyl styrene or a combination thereof, but is not limited thereto.

In an embodiment, the polymer may further include, for example, a structural unit derived from maleimide, maleic anhydride, (meth)acrylonitrile, a derivative thereof or a combination thereof.

In such an embodiment, the structural unit derived from maleimide or a derivative thereof may be, for example, a structural unit derived from maleimide, a substituted or unsubstituted alkyl maleimide, a substituted or unsubstituted cycloalkyl maleimide, a substituted or unsubstituted aryl maleimide or a combination thereof, for example a structural unit derived from a substituted or unsubstituted C1 to C20 alkyl maleimide, a substituted or unsubstituted C3 to C20 cycloalkyl maleimide, a substituted or unsubstituted C6 to C20 aryl maleimide, or a combination thereof. The structural unit derived from maleimide or a derivative thereof may be, for example a structural unit derived from N-substituted maleimide, for example a structural unit derived from N-methylmaleimide, N-ethylmaleimide, N-isopropylmaleimide, N-butylmaleimide, N-isobutylmaleimide, N-t-butylmaleimide, N-n-hexylmaleimide, N-laurylmaleimide, N-cyclohexylmaleimide, N-phenylmaleimide, N-(2-methylphenyl)maleimide, N-(2-ethylphenyl)maleimide, N-(2-n-propylphenyl)maleimide, N-(2-isopropylphenyl)maleimide, N-(2,6-dimethylphenyl)maleimide, N-(2,6-diethylphenyl) maleimide, N-(2,6-diisopropylphenyl)maleimide, N-(2-chlorophenyl)maleimide, N-(2-bromophenyl)maleimide, N-(2-biphenyl)maleimide, N-(2-cyanophenyl)maleimide or a combination thereof, but is not limited thereto.

In an embodiment, the polymer may include a structural unit derived from maleimide, maleic anhydride, (meth)acrylonitrile, a derivative thereof, or a combination thereof, and thus have a higher glass transition temperature, thereby improving heat resistance of the protection film 120.

In an embodiment, the polymer may further include, for example, a structural unit derived from (meth)acrylate or a derivative thereof.

The structural unit derived from (meth)acrylate or a derivative thereof may be, for example a structural unit derived from acrylate, methacrylate, hydroxyalkylacrylate, hydroxyalkyl methacrylate, carboxyalkylacrylate, carboxyalkylmethacrylate, acryloyloxyalkylsuccinic acid, methacryloyloxyalkylsuccinic acid, acryloyloxyalkyl phthalic acid, methacryloyloxyalkyl phthalic acid, or a combination thereof, but is not limited thereto.

In an embodiment, the glass transition temperature of the protection film 120 may be higher than about 100° C. In one embodiment, for example, the glass transition temperature of the protection film 120 may be in a range of about 110° C. to about 150° C., or in a range of about 120° C. to about 140° C.

In an embodiment, the polymer may have, for example a weight average molecular weight in a range of about $5\times10^3$ to about $5\times10^6$. In one embodiment, for example, the polymer may have, for example, a weight average molecular weight in a range of about $5\times10^4$ to about $5\times10^5$.

In one embodiment, for example, the polymer may be a terpolymer consisting of a structural unit derived from styrene or a styrene derivative, a structural unit derived from maleimide, maleic anhydride, acrylonitrile, a derivative thereof or combination thereof, and a structural unit derived from (meth)acrylate or a derivative thereof.

In one embodiment, the first structural unit, the second structural unit and the third structural unit may be included in an amount of about 10 mol % to about 50 mol %, about 10 mol % to about 40 mol %, and about 10 mol % to about 80 mol % based on the terpolymer, respectively.

In an embodiment, the protection film 120 may be prepared by a melt-extruding the polymer described herein into a sheet and by elongating the sheet at a predetermined rate. The melt-extrusion may be performed at a temperature greater than or equal to the melting point of the polymer, for example, at a temperature of about 200° C. to about 350° C. The elongation may be performed at a temperature greater than or equal to the glass transition temperature of the polymer, for example, at a temperature in a range of the glass transition temperature of the polymer ±30° C.

The protection film 120 may be biaxially elongated in two directions, for example, in both of a machine direction ("MD") and a transverse direction ("TD"). The protection film 120 may be about 1.1 times to about 5.0 times elongated. In one embodiment, for example, the protection film 120 may be about 1.2 times to about 3.0 times elongated.

In an embodiment, the protection film 120 may have a thickness of less than or equal to about 80 micrometers (μm). In such an embodiment, the thickness of the protection film 120 may be, for example, in a range of about 5 μm to about 60 μm, in a range of about 5 μm to about 50 μm, in a range of about 5 μm to about 30 μm, or in a range of about 5 μm to about 25 μm, within the range.

In an embodiment, the polarizer 110 and the protection film 120 may contact or be bonded with each other by an adhesive (not shown).

In an embodiment, the protection film 120 may be disposed on the polarizer 110, e.g., a surface or opposing surfaces (e.g., upper and lower surfaces) of the polarizer 110. In an embodiment, where the protection film 120 is disposed on only one of the opposing surfaces of the polarizer 110, a transparent film may be further disposed on the other of the opposing surfaces of the polarizer 110. In an embodiment, the transparent film may be, for example, triacetyl cellulose ("TAC"), but is not limited thereto.

The optical film 100 may further include a compensation film 130 on the protection film 120. The compensation film 130 may be, for example, a λ/4 retardation film or a λ/2 retardation film.

The compensation film 130 may have, for example, refractive indices satisfying the following Relationship Inequations 8 and 9.

$$n_{x2} > n_{y2} \qquad \text{[Relationship Inequation 8]}$$

$$n_{x2} > n_{z2} \qquad \text{[Relationship Inequation 9]}$$

In Relationship Inequations 8 and 9, $n_{x2}$ denotes a refractive index at a slow axis of the compensation film 130, $n_{y2}$ denotes a refractive index at a fast axis of the compensation film 130, and $n_{z2}$ denotes a refractive index in a direction perpendicular to the slow axis and the fast axis of the compensation film 130.

The compensation film 130 may have the refractive indices satisfying Relationship Inequations 8 and 9, and change linearly polarized light passing through the polarizer 110 along with the protection film 120 into circularly polarized light, thereby performing a compensation function. In one embodiment, for example, the optical film 100 may perform an anti-reflection function.

In one embodiment, for example, the compensation film 130 may have refractive indices satisfying the following Relationship Inequation 8a.

$n_{x2} > n_{y2} = n_{z2}$ [Relationship Inequation 8a]

In Relationship Inequation 8a, $n_{y2}$ and $n_{z2}$ may be equal to each other or substantially the same as each other, e.g., $n_{y2}$ and $n_{z2}$ have a refractive index difference of less than or equal to about 10% of $n_{y2}$ or $n_{z2}$, or less than or equal to about 5% of $n_{y2}$ or $n_{z2}$.

In such an embodiment, where the compensation film 130 has refractive indices satisfying Relationship Inequations 8 and 9, the compensation film 130 may have retardations satisfying, for example, the following Relationship Inequations 10 and 11.

$110 \text{ nm} \leq R_{o2}(550 \text{ nm}) \leq 160 \text{ nm}$ [Relationship Inequation 10]

$-250 \text{ nm} \leq R_{th2}(550 \text{ nm}) \leq 250 \text{ nm}$ [Relationship Inequation 11]

In Relationship Inequations 10 and 11, $R_{o2}$ (550 nm) denotes in-plane retardation of the compensation film 130 at 550 nm wavelength, and $R_{th2}$ (550 nm) denotes thickness direction retardation of the compensation film 130 at 550 nm wavelength.

In one embodiment, for example, where the compensation film 130 has refractive indices satisfying Relationship Inequations 8 and 9, the compensation film 130 may have retardations satisfying, for example, the following Relationship Inequations 12 and 13.

$230 \text{ nm} \leq R_{o2}(550 \text{ nm}) \leq 300 \text{ nm}$ [Relationship Inequation 12]

$-250 \text{ nm} \leq R_{th2}(550 \text{ nm}) \leq 250 \text{ nm}$ [Relationship Inequation 13]

The optical film 100 may be disposed on a surface or opposing surfaces (e.g., upper and lower surfaces) of the display device, and perform a polarization function with an additional function. In one embodiment, for example, the optical film 100 may be disposed at a screen side of a display device and thus effectively prevent reflection of light incident from the outside (hereinafter, 'external light anti-reflection'). Accordingly, the external light anti-reflection may effectively prevent visibility deterioration.

Figure 2:
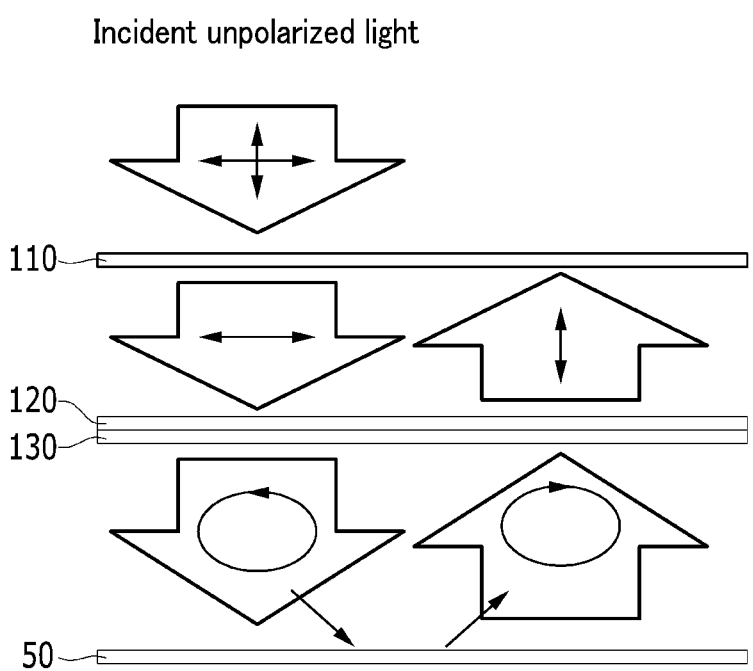
FIG. 2 is a schematic view showing the external light anti-reflection principle of an embodiment of an optical film.

FIG. 2 is a schematic view showing the external light anti-reflection principle of an embodiment of an optical film.

Referring to FIG. 2, while the incident unpolarized light (hereinafter, referred to as "external light") entered from the outside is passed through the polarizer 110, and the polarized light is shifted into circularly polarized light by passing through the protection film 120 and optionally the compensation film 130, only a first polarized perpendicular component, which is one polarized perpendicular component of two polarized perpendicular components, is transmitted. While the circularly polarized light is reflected in a display panel 50 including a substrate and an electrode, for example, and changes the circular polarization direction, and the circularly polarized light is passed through optionally the compensation film 130 and the protection film 120 again, only a second polarized perpendicular component, which is the other polarized perpendicular component of the two polarized perpendicular components, may be transmitted. As the second polarized perpendicular component is not passed through the polarizer 110, light does not exit to the outside, thereby effectively preventing the external light reflection.

The optical film 100 may further include a correction layer (not shown) disposed on the protection film 120. The correction layer may be, for example, a color shift resistant layer, but is not limited thereto.

The optical film 100 may further include a light blocking layer (not shown) extended along an edge thereof. The light blocking layer may be in a strip shape, or formed as a strip, along the circumference of the optical film 100, and may be, for example, disposed between the polarizer 110 and the protection film 120 and/or between the protection film 120 and the compensation film 130. The light blocking layer may include an opaque material, for example, a black material. In one embodiment, for example, the light blocking layer may include or be made of a black ink.

In an embodiment, as described above, the optical film 100 includes the protection film 120 additionally having a compensation function, and thus may perform a compensation function such as improvement of a viewing angle without a separate compensation film.

In such an embodiment, the optical film 100 includes the protection film 120 additionally having a compensation function and thus may have a thinner thickness due to omission of the compensation film. Accordingly, a thinner optical film may be realized and ultimately realize a thin display device.

In such an embodiment, the optical film 100 may be effectively prevented or suppressed from degradation of optical properties due to heat generated during the process and/or the operation by reinforcing heat resistance of the protection film 120.

In such an embodiment, since the protection film 120 may be prepared through a process such as melt-extrusion, the process may be simplified compared to a conventional protection film, such as TAC, thereby reducing a manufacturing cost and a unit price.

Such an embodiment of the optical film 100 may be applied to various display devices.

In an embodiment, a display device includes a display panel and an optical film disposed on the display panel. In such an embodiment, the optical film may be an embodiment of the optical film 100 described above. In such an embodiment, the display panel may be a liquid crystal panel or an organic light emitting display panel, but is not limited thereto.

Hereinafter, an embodiment where display device is an organic light emitting display device will be described with reference to FIG. 3.

Figure 3:
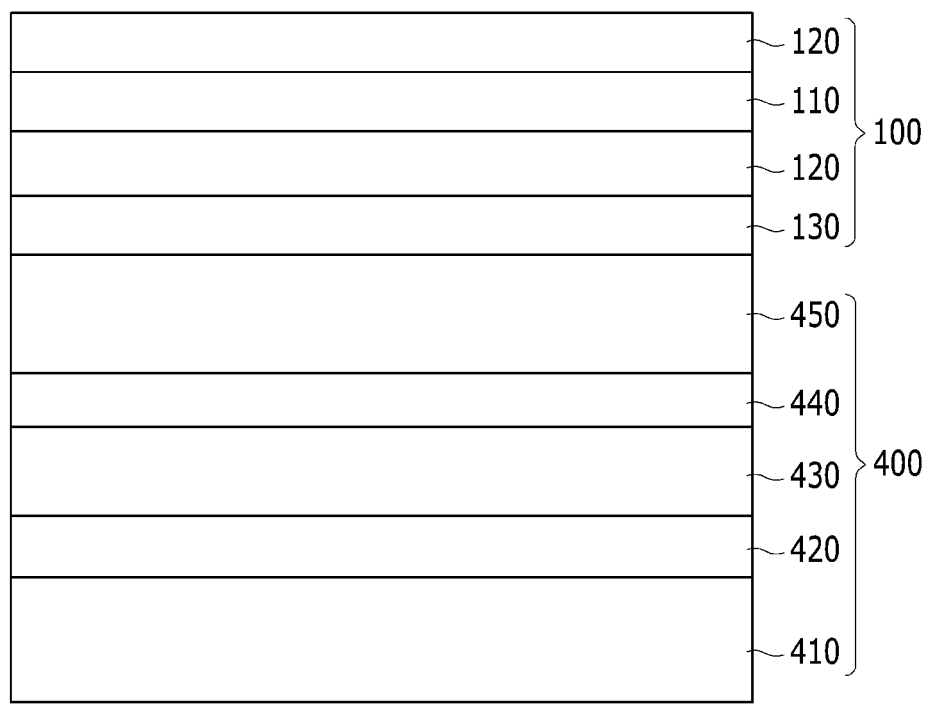
FIG. 3 is a schematic cross-sectional view showing an organic light emitting display according to an embodiment.

FIG. 3 is a schematic cross-sectional view showing an organic light emitting display according to an embodiment.

Referring to FIG. 3, an embodiment of the organic light emitting display device includes an organic light emitting display panel 400 and an optical film 100 disposed on the organic light emitting display panel 400.

The organic light emitting display panel 400 may include a base substrate 410, a lower electrode 420, an organic emission layer 430, an upper electrode 440 and an encapsulation substrate 450.

The base substrate 410 may include or be made of glass or plastic.

One of the lower electrode 420 and the upper electrode 440 may be an anode, and the other one of the lower electrode 420 and the upper electrode 440 may be a cathode.

The anode is an electrode injected with holes, and may include or be made of a transparent conductive material having a high work function to transmit the emitted light to the outside, for example, indium tin oxide ("ITO") or indium zinc oxide ("IZO"). The cathode is an electrode injected with electrons, may include or be made of a conductive material having a low work function and not affecting the organic material, and may include a material selected from, for example, aluminum (Al), calcium (Ca) and barium (Ba).

The organic emission layer 430 includes an organic material which may emit light when a voltage is applied to the lower electrode 420 and the upper electrode 440.

An auxiliary layer (not shown) may be further disposed between the lower electrode 420 and the organic emission layer 430 and between the upper electrode 440 and the organic emission layer 430. The auxiliary layer is used to balance electrons and holes, and may include a hole transport layer, a hole injection layer ("HIL"), an electron injection layer ("EL"), and an electron transporting layer.

The encapsulation substrate 450 may include or be made of glass, metal, or a polymer, and may seal the lower electrode 420, the organic emission layer 430 and the upper electrode 440 to effectively prevent moisture and/or oxygen inflow from the outside.

The optical film 100 may be disposed on a side to which light is emitted. In an embodiment, where the organic light emitting display panel 400 has a bottom emission structure in which light is emitted from an outer surface of the base substrate 410, the compensation film 100 and the polarizer 200 may be disposed on the outer surface of the base substrate 410. In an alternative embodiment, where the organic light emitting display panel 400 has a top emission structure, in which light is emitted from an outer surface of the encapsulation substrate 450, the compensation film 100 and the polarizer 200 may be disposed on outer surface of the encapsulation substrate 450.

In such an embodiment, the optical film 100 includes the polarizer 110, the protection film 120 additionally having a compensation function, and optionally the compensation film 130, as described above. The polarizer 110, the protection film 120 and the compensation film 130 are respectively the same as those described above, and the optical film 100 may effectively prevent light passing the polarizer 110 from being reflected by a metal such as an electrode and the like in the organic light emitting display panel 400 and thus effectively prevent visibility from being deteriorated by external light. Accordingly, display characteristics of the organic light emitting display device may be improved.

Hereinafter, an embodiment where display device is a liquid crystal display ("LCD") device will be described with reference to FIG. 4.

Figure 4:
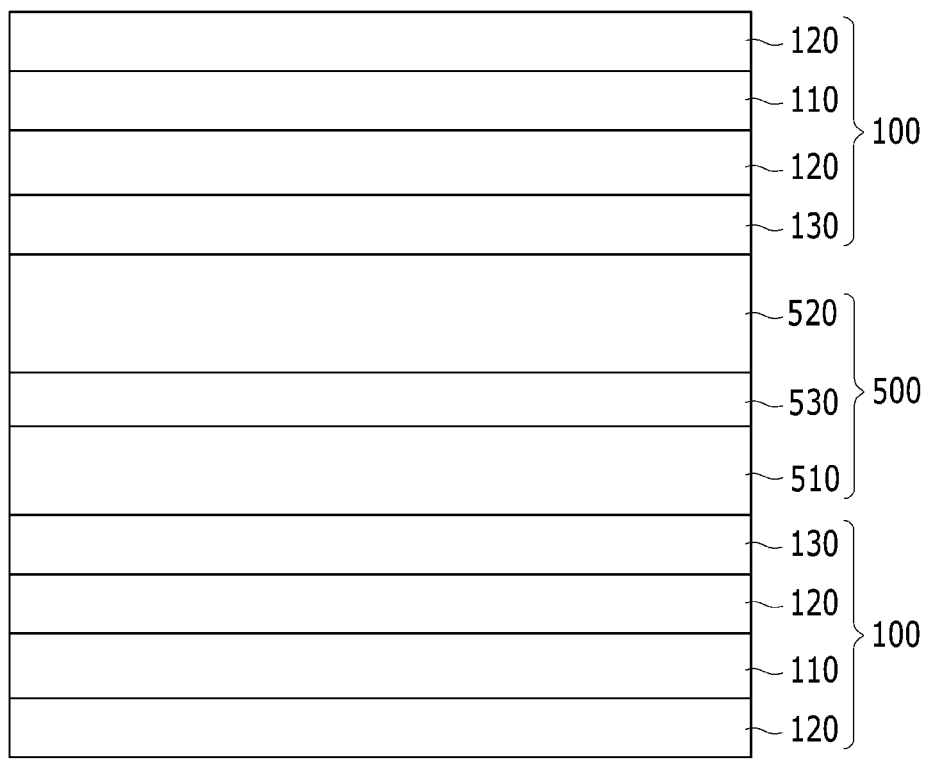
FIG. 4 is a schematic cross-sectional view showing a liquid crystal display ("LCD") according to an embodiment.

FIG. 4 is a cross-sectional view schematically showing an LCD device according to an embodiment.

Referring to FIG. 4, an embodiment of the LCD device includes an LCD panel 500, and an optical film 100 disposed on a surface or opposing surfaces (e.g., upper and lower surfaces) of the liquid crystal display panel 500.

The liquid crystal display panel 500 may be a twist nematic ("TN") mode panel, a vertical alignment ("VA") mode panel, an in-plane switching ("IPS") mode panel, an optically compensated bend ("OCB") mode panel, or the like.

The liquid crystal display panel 500 may include a first display panel 510, a second display panel 520 disposed opposite to the first display panel 510, and a liquid crystal layer 530 interposed between the first display panel 510 and the second display panel 520.

In an embodiment, the first display panel 510 may include, for example, a thin film transistor (not shown) disposed on a substrate (not shown) and a first electric field generating electrode (not shown) connected to the thin film transistor, and the second display panel 520 may include, for example, a color filter (not shown) disposed on a substrate (not shown) and a second electric field generating electrode (not shown), but not being limited thereto. In an alternative embodiment, the color filter may be disposed in the first display panel 510, and the first electric field generating electrode and the second electric field generating electrode may be disposed in the first display panel 510.

The liquid crystal layer 530 may include a plurality of liquid crystal molecules. The liquid crystal molecules may have positive or negative dielectric anisotropy. In an embodiment where the liquid crystal molecules have positive dielectric anisotropy, the major (or longitudinal) axes thereof may be aligned substantially parallel to the surface of the first display panel 510 and the second display panel 520 when an electric field is not applied thereto, and the major axes thereof may be aligned substantially perpendicular to the surface of the first display panel 510 and second display panel 520 when an electric field is applied thereto. In an embodiment, where the liquid crystal molecules have negative dielectric anisotropy, the major axes thereof may be aligned substantially perpendicular to the surface of the first display panel 510 and the second display panel 520 when an electric field is not applied thereto, and the major axes thereof may be aligned substantially parallel to the surface of the first display panel 510 and the second display panel 520 when an electric field is applied thereto.

In an embodiment, the optical film 100 is disposed on a surface of the liquid crystal display panel 500. In an embodiment, the optical film 100 may be disposed on opposing surfaces (e.g., upper and lower surfaces) of the liquid crystal display panel 500 as shown in FIG. 4, but not being limited thereto. In an alternative embodiment, the optical film 100 may be disposed on only one of the opposing surfaces of liquid crystal display panel 500.

In such an embodiment, the optical film 100 includes the polarizer 110, the protection film 120 additionally having a compensation function, and optionally the compensation film 130, as described above.

Hereinafter, embodiments of the disclosure will be described in greater detail with reference to examples. However, such examples are merely exemplary, and embodiments of the disclosure are not limited thereto.

Manufacture of Protection Film

PREPARATION EXAMPLES 1 to 9

A 100 μm-thick melt-extruded copolymer film of poly (styrene-methyl methacrylate-maleic anhydride) terpolymer (DENKA, Japan) (Tg=126° C.) is respectively 50% to 200% biaxially elongated toward two directions (MD and TD), at a temperature in a range of about 130° C. to 160° C., thereby preparing protection films having retardation as in Table 1 and a thickness of about 20 micrometer (μm).

The retardations (e.g., an in-plane retardation and a thickness direction retardation) of protection films are measured by using an Axoscan equipment (Axometrics, Inc.) at a wavelength in a range from 400 nm to 700 nm and adjusting an incident angle by 5° from an angle in a range of −70° to 70°.

TABLE 1

|  | Refractive indices | In-plane retardation ($R_{o1}$, nm) (@ 550 nm) | Thickness direction retardation ($R_{th1}$, nm) (@ 550 nm) |
|---|---|---|---|
| Preparation Example 1 | $n_{z1} > n_{x1} = n_{y1}$ | 3 | −70 |
| Preparation Example 2 | $n_{z1} > n_{x1} = n_{y1}$ | 5 | −100 |
| Preparation Example 3 | $n_{z1} > n_{x1} = n_{y1}$ | 5 | −165 |
| Preparation Example 4 | $n_{z1} > n_{x1} = n_{y1}$ | 2 | −98 |
| Preparation Example 5 | $n_{z1} > n_{x1} = n_{y1}$ | 2 | −80 |
| Preparation Example 6 | $n_{z1} > n_{x1} = n_{y1}$ | 3 | −53 |
| Preparation Example 7 | $n_{y1} > n_{x1} = n_{z1}$ | 230 | −103 |
| Preparation Example 8 | $n_{y1} > n_{x1} = n_{z1}$ | 125 | −57 |
| Preparation Example 9 | $n_{y1} > n_{x1} = n_{z1}$ | 143 | −66 |

*$n_{x1}$: a refractive index at a slow axis of the protection film
*$n_{y1}$: a refractive index at a fast axis of the protection film
*$n_{z1}$: a refractive index in a direction perpendicular to the slow axis and the fast axis of the protection film Manufacture of Optical Film I

Example 1

A polyvinylalcohol film (PS 60, Kuraray Co., Ltd.) is elongated to 25 μm thickness to prepare an elongated polyvinylalcohol film, and the protection film according to Preparation Example 1 is attached to both opposing sides of the elongated polyvinylalcohol film, thereby preparing an optical film.

Example 2

A polyvinylalcohol film (PS 60, Kuraray Co., Ltd.) is elongated to 25 μm thickness to prepare an elongated polyvinylalcohol film, and the protection film according to Preparation Example 7 is attached to both opposing sides of the elongated polyvinylalcohol film, thereby preparing an optical film.

Comparative Example 1

A polyvinylalcohol film (PS 60, Kuraray Co., Ltd.) is elongated to 25 μm thickness to prepare an elongated polyvinylalcohol film, and then, a TAC film (Fuji Film Holdings Co.) is attached to both opposing sides of the elongated polyvinylalcohol film, thereby preparing an optical film.

Evaluation 1

Thicknesses of the optical films according to thicknesses of Examples 1 and 2 and Comparative Example 1 are measured and compared as shown in Table 2.

TABLE 2

|  | Thickness of optical film (μm) |
|---|---|
| Example 1 | 65 |
| Example 2 | 65 |
| Comparative Example 1 | 105 |

Referring to Table 2, the optical films according to Examples 1 and 2 have a thinner thickness than that of the optical film according to Comparative Example 1. Accordingly, the optical films according to Examples 1 and 2 are thinner than the optical film according to Comparative Example 1.

Evaluation 2

Reliability of the optical films according to Examples 1 and 2 and Comparative Example 1 is evaluated.

The reliability of the optical films is evaluated by measuring optical property change under a high temperature and high humidity environment and specifically, by measuring transmittance change (ΔTs) and degree change of polarization (ΔPE) of the optical films after being disposed in a chamber having relative humidity of 95% at 60° C. for 100 hours.

The transmittance and the degree of polarization are measured by using a UV-VIS spectrophotometer (V-7100, JASCO Products Company).

The results are provided in Table 3.

TABLE 3

|  | Changes of transmittance (ΔTs) (%) | Degrees of changes of polarization (ΔPE) (%) |
|---|---|---|
| Example 1 | −1.17 | −0.17 |
| Example 2 | −1.20 | −0.11 |
| Comparative Example 1 | +4.99 | −13.94 |

Referring to Table 3, the optical films according to Examples 1 and 2 show small transmittance changes and degrees of changes of polarization compared with the optical film according to Comparative Example 1. Accordingly, the optical films according to Examples 1 and 2 show higher reliability than the optical film according to Comparative Example 1.

Manufacture of Optical Film II

Example 3

A polyvinylalcohol film (PS 60, Kuraray Co., Ltd.) is elongated to 25 μm thickness to prepare an elongated polyvinylalcohol film, and then, the protection film according to Preparation Example 1 is attached to one side of the elongated polyvinylalcohol film, while a TAC film (Fuji Film Holdings Co.) is attached to the other side thereof. Subsequently, λ/4 phase delay layer (WRS, Teijin Ltd.) is attached to one side of the protection film, thereby obtaining an optical film.

Example 4

A polyvinylalcohol film (PS 60, Kuraray Co., Ltd.) is elongated to 25 μm thickness to prepare an elongated polyvinylalcohol film, and the protection film according to Preparation Example 2 is attached to one side of the elongated polyvinylalcohol film, while a TAC film (Fuji Film Holdings Co.) is attached to the other side thereof. Subsequently, a λ/4 phase delay layer (WRS, Teijin Ltd.) is attached to one side of the protection film, thereby obtaining an optical film.

Comparative Example 2

A polyvinylalcohol film (PS 60, Kuraray Co. Ltd.) is elongated to 25 μm thickness to prepare an elongated polyvinylalcohol film, and then, a TAC film (Fuji Film Holdings Co.) is respectively attached to both side of the elongated polyvinylalcohol film. Subsequently, a λ/4 phase delay layer (WRS, Teijin Ltd.) is attached to one side of the protection film, thereby obtaining an optical film.

Manufacture of Display Device

Example 5

An organic light emitting display device is manufactured by attaching the optical film according to Example 3 to an organic light-emitting display panel (Galaxy S5 panel, Samsung Display).

Example 6

An organic light emitting display device is manufactured by attaching the optical film according to Example 4 to an organic light-emitting display panel (Galaxy S5 panel, Samsung Display).

Comparative Example 3

An organic light emitting display device is manufactured by attaching the optical film according to Comparative Example 2 to an organic light-emitting display panel (Galaxy S5 panel, Samsung Display).

Evaluation 3

The organic light emitting display devices according to Examples 5 and 6 and Comparative Example 3 are evaluated regarding reflectance and reflective color at the front side.

The reflection and the reflective color at the front side are measured by using a spectrum colorimeter (CM-3600d, Konica Minolta, Inc.), while light is supplied with a light source of D65 under a condition of 8° reflection and a 2° light-receiving.

The reflective color may be marked by a CIE-Lab color coordinate, positive a* indicates red, negative a* indicates green, positive b* indicates yellow, and negative b* indicates blue, and as the a* and b* have a larger absolute value, the colors become strong.

The results are provided in Table 4.

TABLE 4

| | Reflectance at front side (%) | Reflective color at front side | | |
|---|---|---|---|---|
| | | a* | b* | Δa*b* |
| Example 5 | 0.6 | 1.0 | −5.5 | 5.6 |
| Example 6 | 0.6 | 1.1 | −5.6 | 5.7 |
| Comparative Example 3 | 0.6 | 1.3 | −6.3 | 6.4 |

$\Delta a^* b^* = \sqrt{a^{*2} + b^{*2}}$

Referring to Table 4, the organic light emitting display devices according to Examples 5 and 6 show equivalent or improved reflectance at the front side and a small reflective color compared with the organic light emitting display device according to Comparative Example 3. The small reflective color means that the color is much closer to black, a small color tone change, and satisfactory visibility due to anti-reflection of external light.

Accordingly, the organic light emitting display devices according to Examples 5 and 6 show equivalent or improved reflectance and reflective color at the front side, while the thickness of the optical film is decreased as describe above, and thus have thinness and improved display characteristics.

Evaluation 4

The organic light emitting display devices according to Examples 5 and 6 and Comparative Example 3 are evaluated regarding reflectance and reflective color at the side.

The reflectance and reflective color at the side are measured by supplying with light by using a light source of D65 at a reflection degree of 45° and by using a spectrum colorimeter (DMS, Display Measurement Systems, Instrument Systems).

The results are provided in Table 5.

TABLE 5

| | Reflectance at side (%) | Reflective color at side | | |
|---|---|---|---|---|
| | | a* | b* | Δa*b* |
| Example 5 | 0.7 | −2.6 | −1.6 | 3.1 |
| Example 6 | 0.8 | −1.1 | −4.7 | 4.8 |
| Comparative Example 3 | 1.4 | −7.1 | −3.5 | 8.0 |

$\Delta a^* b^* = \sqrt{a^{*2} + b^{*2}}$

Referring to Table 5, the organic light emitting display devices according to Examples 5 and 6 have improved reflectance and a small reflective color at the side compared with the organic light emitting display device according to Comparative Example 3.

Accordingly, the organic light emitting display devices according to Examples 5 and 6 have improved reflectance and reflective color at the side while the thickness of the optical film is reduced and thus show improved display characteristics as well as thinness.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An optical film comprising:
   a polarizer; and
   a protection film disposed on the polarizer and comprising a polymer having a glass transition temperature of greater than about 100° C.,
   wherein the polymer is a terpolymer consisting of:
   a first structural unit derived from styrene or a styrene derivative;
   a second structural unit derived from maleimide, maleic anhydride, acrylonitrile, a derivative thereof or a combination thereof; and
   a third structural unit derived from (meth)acrylate or a derivative thereof,
   wherein refractive indices of the protection film satisfies the following inequations:

$n_{z1} > n_{x1} = n_{y1}$, wherein
   $n_{x1}$ denotes a refractive index at a slow axis of the protection film,
   $n_{y1}$ denotes a refractive index at a fast axis of the protection film, and
   $n_{z1}$ denotes a refractive index in a direction perpendicular to the slow axis and the fast axis of the protection film, wherein retardations of the protection film satisfies the following inequations:

$$-60 \text{ nm} \leq R_{o1} (550 \text{ nm}) \leq 60 \text{ nm; and } -200 \text{ nm} \leq R_{th1} (550 \text{ nm}) < -10 \text{ nm},$$

wherein $R_{o1}$ (550 nm) denotes an in-plane retardation of the protection film at 550 nanometers wavelength, and $R_{th1}$ (550 nm) denotes a thickness direction retardation of the protection film at 550 nanometers wavelength.

2. The optical film of claim 1, wherein refractive indices of the protection film satisfies the following inequation:

$$n_{y1} > n_{x1} = n_{z1},$$

wherein $n_{x1}$ denotes a refractive index at a slow axis of the protection film, $n_{y1}$ denotes a refractive index at a fast axis of the protection film, and $n_{z1}$ denotes a refractive index in a direction perpendicular to the slow axis and the fast axis of the protection film.

3. The optical film of claim 2, wherein retardations of the protection film satisfies the following inequations:

$$110 \text{ nm} \leq R_{o1}(550 \text{ nm}) \leq 300 \text{ nm; and } -300 \text{ nm} \leq R_{th1} (550 \text{ nm}) \leq 0 \text{ nm},$$

wherein $R_{o1}$ (550 nm) denotes an in-plane retardation of the protection film at 550 nanometers wavelength, and $R_{th1}$ (550 nm) denotes a thickness direction retardation of the protection film at 550 nanometers wavelength.

4. The optical film of claim 1, wherein the first structural unit is derived from styrene, a substituted or unsubstituted alkyl styrene, a substituted or unsubstituted aryl styrene, halogen styrene, a substituted or unsubstituted alkoxy styrene, a substituted or unsubstituted nitro styrene, a substituted or unsubstituted amino styrene, a substituted or unsubstituted carboxyl styrene, or a combination thereof.

5. The optical film of claim 1, wherein the first structural unit, the second structural unit, and the third structural unit are included in an amount of about 10 mol % to about 50 mol %, about 10 mol % to about 40 mol %, and about 10 mol % to about 80 mol % based on the terpolymer, respectively.

6. The optical film of claim 1, wherein the glass transition temperature of the polymer is in a range of about 110° C. to about 150° C.

7. The optical film of claim 1, wherein the protection film is about 1.1 times to about 5.0 times elongated.

8. The optical film of claim 7, wherein the protection film is biaxially elongated.

9. The optical film of claim 1, wherein the protection film has a thickness ranging from about 5 micrometer to about 30 micrometer.

10. The optical film of claim 1, wherein the polarizer and the protection film are bonded to each other.

11. The optical film of claim 1, further comprising:
a compensation film disposed on the protection film,
wherein the compensation film is a λ/4 retardation film or a λ/2 retardation film.

12. The optical film of claim 11, wherein refractive indices of the compensation film satisfies the following inequation:

$$n_{x2} > n_{y2}; \text{ and } n_{x2} > n_{z2},$$

wherein $n_{x2}$ denotes a refractive index at a slow axis of the compensation film, $n_{y2}$ denotes a refractive index at a fast axis of the compensation film, and $n_{z2}$ denotes a refractive index in a direction perpendicular to the slow axis and the fast axis of the compensation film.

13. A display device comprising
a display panel, and
the optical film of claim 1.

14. A method of forming an optical film, the method comprising
preparing a polarizer,
melt-extruding a polymer having a glass transition temperature of greater than 100° C. and elongating the melt-extruded polymer to prepare a protection film, and
the protection film disposed on the polarizer,
wherein the polymer is a terpolymer consisting of:
a first structural unit derived from styrene or a styrene derivative;
a second structural unit derived from maleimide, maleic anhydride, acrylonitrile, a derivative thereof or a combination thereof; and
a third structural unit derived from (meth)acrylate or a derivative thereof,
wherein refractive indices of the protection film satisfies the following inequations:

$$n_{z1} > n_{x1} = n_{y1},$$

wherein $n_{x1}$ denotes a refractive index at a slow axis of the protection film, $ny_{y1}$ denotes a refractive index at a fast axis of the protection film, and $n_{z1}$ denotes a refractive index in a direction perpendicular to the slow axis and the fast axis of the protection film, wherein retardations of the protection film satisfies the following inequations:

$$-60 \text{ nm} \leq R_{o1}(550 \text{ nm}) \leq 60 \text{ nm; and } -200 \text{ nm} \leq R_{th1} (550 \text{ nm}) < -10 \text{ nm},$$

wherein $R_{o1}$ (550 nm) denotes an in-plane retardation of the protection film at 550 nanometers wavelength, and $R_{th1}$ (550 nm) denotes a thickness direction retardation of the protection film at 550 nanometers wavelength.

15. The method of claim 14, wherein
the melt-extruding the polymer is performed at a temperature in a range of about 200° C. to about 350° C., and
the elongation of the polymer is performed at a temperature in a range of a glass transition temperature of the polymer ±30° C.

16. An optical film comprising:
a polarizer; and
a protection film disposed on the polarizer and comprising a polymer having a glass transition temperature of greater than about 100° C.,
wherein the polymer is a terpolymer consisting of:
a first structural unit derived from styrene or a styrene derivative;
a second structural unit derived from maleimide, maleic anhydride, acrylonitrile, a derivative thereof or a combination thereof; and
a third structural unit derived from (meth)acrylate or a derivative thereof,
wherein refractive indices of the protection film satisfies the following inequation:

$$n_{z1} > n_{x1} = n_{y1},$$

wherein
$n_{x1}$ denotes a refractive index at a slow axis of the protection film,
$n_{y1}$ denotes a refractive index at a fast axis of the protection film, and
$n_{z1}$ denotes a refractive index in a direction perpendicular to the slow axis and the fast axis of the protection film.

\* \* \* \* \*